United States Patent [19]

Boucharlat et al.

[11] Patent Number: 4,654,713
[45] Date of Patent: Mar. 31, 1987

[54] CHARGE TRANSFER PHOTOSENSITIVE DEVICE

[75] Inventors: Gilles Boucharlat, Saint-Egreve; Jean Chabbal, Grenoble, both of France

[73] Assignee: Thomson—CSF, Paris, France

[21] Appl. No.: 571,568

[22] Filed: Jan. 17, 1984

[30] Foreign Application Priority Data

Jan. 21, 1983 [FR] France .................... 83 00917

[51] Int. Cl.[4] .................... H04N 3/14; H04N 1/024
[52] U.S. Cl. .................... 358/213; 358/294
[58] Field of Search ............... 358/213, 212, 293, 294; 357/24 LR

[56] References Cited

U.S. PATENT DOCUMENTS 3,911,467 10/1975 Levine .................... 358/273
4,432,017 2/1984 Stoffel et al. .................... 358/213
4,471,387 9/1984 Nadler .................... 358/213

FOREIGN PATENT DOCUMENTS 0060149 9/1982 European Pat. Off. .
2304448 3/1972 Fed. Rep. of Germany .
57-68971 4/1982 Japan .

OTHER PUBLICATIONS

Research Disclosure #202, Feb. '81, pp. 103–104.

Primary Examiner—Thomas W. Brown
Assistant Examiner—Stephen Brinich
Attorney, Agent, or Firm—Roland Plottel

[57] ABSTRACT

This device comprises a photosensitive strip, of which one photosensitive element out of two is shifted in the direction of analysis of the image, the photosensitive elements being disposed according to a first and second row. This device comprises two charge transfer shift registers. Each stage of the registers comprises two inputs of the charges and inputs of the registers are connected alternately to the first and to the second row of photosensitive elements. Are transferred successively in each register the charges due to each line of the analyzed image that were accumulated in the first row of elements for a given integration duration then the charges due to this line and accumulated in the second row of elements for the same integration duration.

8 Claims, 14 Drawing Figures

CHARGE TRANSFER PHOTOSENSITIVE DEVICE

BACKGROUND OF THE INVENTION

1. Field of the Invention

The present invention concerns a linear-type charge transfer photosensitive device.

2. Description of the Prior Art

Linear charge transfer photosensitive devices are well known from the prior art. These devices generally comprise a "strip" constituted by aligned photosensitive elements. The image to be analyzed is projected line after line on the strip; either the strip or the image to be analyzed is displaced. An optical element can also be used that projects line after line the image to be analyzed, immobile, on the immobile strip.

The charges accumulated in the strip are periodically transferred in parallel in a charge transfer shift register, then transferred in series towards the output of the register where they are read; i.e. converted into a voltage that is amplified.

The charge transfer shift register by its dimensions conditions the minimal dimensions that can be given to the photosensitive elements of the strip, and thus the resolution of the device.

Consequently, two shift registers located on either side of the strip are used. Each register processes half of the photosensitive elements and this allows to double the resolution by doubling the number of the addressable photosensitive elements.

The resolution of the photosensitive devices remains, however, limited by the dimensions of the shift registers used.

For example, in the case of a biphase structure transfer charge shift register, in which the dissymetry is ensured by an overthickness of the oxide, each stage of the register that processes a photosensitive element occupies about 20 μm.

If two registers are used, the photosensitive elements have a pitch that cannot be smaller than 10 μm.

Several solutions have been proposed in order to diminish the pitch, among which can be cited:

the utilization of registers in coil, which present above all the drawback of being difficult to design;

doubling the number of registers, i.e. the utilization of four registers instead of two;

the sequential transfer of data from the strip towards the registers, this sequential transfer being controlled by a logic shift register;

furthermore, the introduction of a memory between the photosensitive strip and each register, the memory receiving data that are transferred in two steps into each register.

The problem that occurs is that the known solutions generally allow to double the pitch but substantially double the space occupied by the photosensitive device. The present invention overcomes this problem and allows to double the pitch without increasing the space occupied by the device.

SUMMARY OF THE INVENTION

The charge transfer photosensitive device for the analysis of images, line after line, according to the invention comprises:

a strip of photosensitive elements, of which one photosensitive element out of two is shifted in the analysis direction of the image, the elements being disposed in a first and a second row;

at least one charge transfer shift register with parallel inputs and series output;

means ensuring, for one line analyzed, the transfer in the register and the reading, successively, of the charges due to this line and accumulated in the first row of elements, for a given integration duration, and then, of the charges due to this line and accumulated in the second row of elements, during the same integration period.

The geometry adopted for the photosensitive strip allows, without it being necessary to have a memory, to use twice over the same register to analyze a single line. The resolution of the strip can thus be doubled for a given space requirement of the photosensitive device.

Certain embodiments of the device according to the invention present the advantage of allowing the obtention of an adjustable integration time.

This allows to adapt the integration time and thus the sensitiveness of the device, to the degree of illumination received.

This also allows to diminish the integration time in order not to confuse the data from several lines, when the displacement speed of the image on the strip is increased, in order to improve the transversal resolution, i.e. the resolution in the sense of running of the image.

In one of these embodiments, the device according to the invention allows to dispose of two resolutions. This device can thus be used, for example, in a telecopier having two switchboards.

BRIEF DESCRIPTION OF THE DRAWINGS

Other objects, characteristics and results of the invention will become apparent from reading through the following description, given by way of non-limitative example and illustrated by the annexed figures that represent:

FIGS. 4a and b, schemes representing the structure of a biphase register and explaining its operation;

FIGS. 9a and b, a transversal section view and a scheme explaining the operation of a device according to the invention at variable integration time;

FIGS. 10a to e, control signals applied to the variable integration time devices;

FIGS. 12a to c and 14a, b and c, the control signals applied to the devices having two resolutions.

DESCRIPTION OF THE PREFERRED EMBODIMENT

Figure 1:
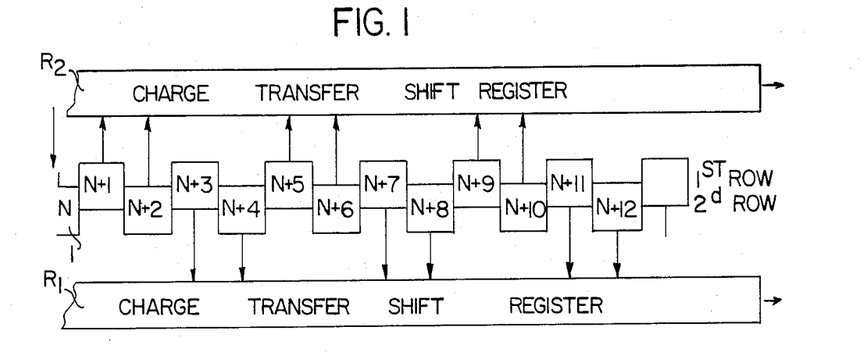
FIG. 1 a simplified diagram of the invention according to the invention.

FIG. 1 is a simplified diagram of the device according to the invention.

It concerns a linear type device that comprises a photosensitive strip 1 constituted by a plurality of photosensitive elements. On FIG. 1, the photosensitive elements are represented by squares called N, N+1, N+2 . . . One photosensitive element out of two is shifted in the analysis direction of the image that is vertical as represented by an arrow on the drawing. The photosensitive elements N, N+2, N+4, N+6 . . . are disposed along a first row and the intermediary photosensitive elements N+1, N+3, N+5 . . . are disposed along a second row which, by way of example, is shifted vertically with respect to the first row of the half of the side of the photosensitive dots.

As explained in the introduction to the description, two charge transfer shift registers $R_1$ and $R_2$ are generally used, these registers being located on either side of the strip. These registers have parallel inputs and series output. Each register processes half of the photosensitive elements.

On FIG. 1, the register $R_2$ is connected to the photosensitive dots N+1, N+2, N+5, N+6 . . . and the register $R_1$ to dots N+3, N+4, N+7, N+8 . . . It is of course possible to dispose differently the photosensitive dots of the strip between the two registers.

It is preferable that each register processes the photosensitive elements belonging to the two rows of the strip, since as these two rows are transferred in the registers at different instants, the dimensions of the registers can thus be reduced and the resolution of the strip increased.

According to the invention, and as it will be explained afterwards means which are not represented on the FIG. 1, ensure, for each line analyzed, the transfer in the registers and the reading, successively, of the charges due to this line and accumulated in the first row of elements, for a given integration duration, then of the charges due to this line and accumulated in the second row of elements, during the same integration period.

Each line of the image to be analyzed sweeps at constant speed the surface of the photosensitive strip. It sweeps first of all the first row of elements. Since this is represented schematically on FIG. 2, there is first of all integration of the charges due to one line of the image by the first row of elements. Once the integration is achieved, the content of the first row is transferred into the registers. The integration of the charges due to the same line of the image by the second row of elements starts at the middle of the integration period of the charges by the first row due to the shift of the half of the height of the photosensitive dots adopted on FIG. 1. When this integration has been achieved, the charges issuing from the first row must have left the registers, since the transfer in the registers of the charges issuing from the second row thus begins . . . and so on thereafter for each line of the image to be analyzed, the geometry of the strip allows to use twice over the same register to process the datas issuing from the same line of the image to be analyzed.

According to the invention, the said means also ensure the adaptation of the displacement speed of each line to be analyzed on the strip to the shift between the two rows of photosensitive dots so that two successive readings of the register concern a single line of the image.

Figure 3:
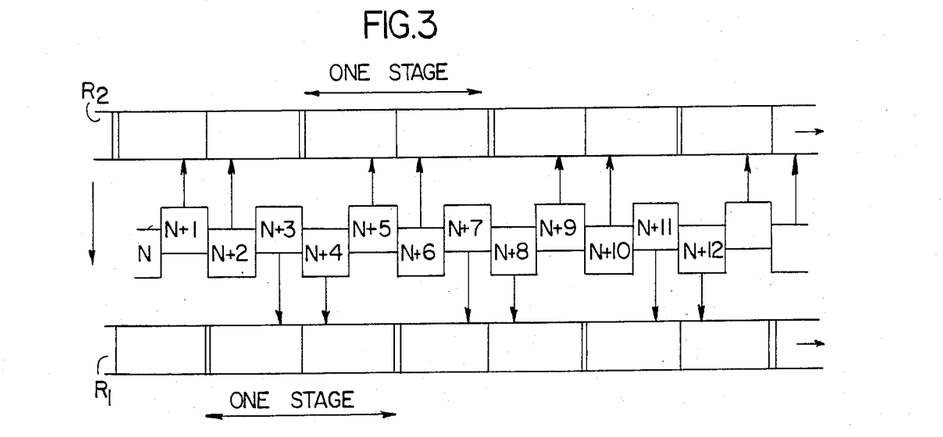
FIG. 3 the scheme of a preferred embodiment of the invention.

FIG. 3 represents the scheme of a preferred embodiment of the invention in which charge transfer shift registers $R_1$ and $R_2$ are used, each stage of the register comprising two charge imputs.

Figures 4A, 4B:
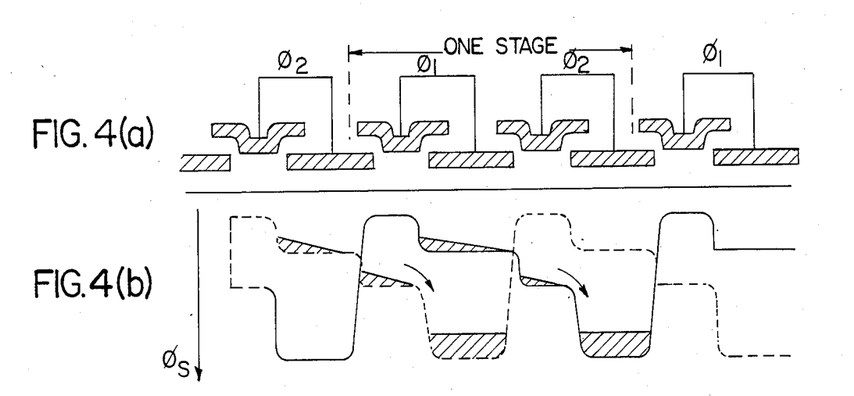

It concerns, for example, biphase or monophase operating registers. FIG. 4a represents a transversal section of one stage of a biphase operating register. This stage is constituted by four electrodes, connected two by two to a single clock signal $\phi_1$ or $\phi_2$. The two clock signals $\phi_1$ and $\phi_2$ are in phase opposition. FIG. 4b shows the evolution of the surface potential $\phi_S$ in the substrate when $\phi_1$-(continuous lines) or $\phi_2$ (broken lines) is at the low level.

This stage comprises two inputs since it is possible, at different instants, to send the charges under the storage electrode connected to $\phi_1$ or under that connected to $\phi_2$.

On FIG. 3, each stage of the register is delimited by two vertical lines and is separated into two parts each having an input.

According to the invention, the inputs of the registers used are connected alternately to the first and to the second row of the photosensitive elements.

On FIG. 3, the photosensitive dots N+1 and N+2 of the first and second rows are connected to the register $R_2$ and the photosensitive dots N+3 and N+4 of the first and of the second row are connected to the register $R_1$. It is of course possible to distribute differently the photosensitive dots of the strip between the two registers while alternately connecting to the first and to the second row the inputs of the registers.

In the shift registers that are used—registers of which each stage comprises two parts each having a charge input—during a transfer, there must only be charges present in one of the parts of each stage, otherwise there is a risk of confusing the data.

According to the invention, have been successively transferred from the strip towards the registers the datas from the first row of the strip then the datas from the second row. Therefore, only one part out of two of each stage is filled at one time and there is no confusion of data.

The number of stages of these registers with respect to the number of photosensitive dots that they process can thus be reduced by one half.

Figure 5:
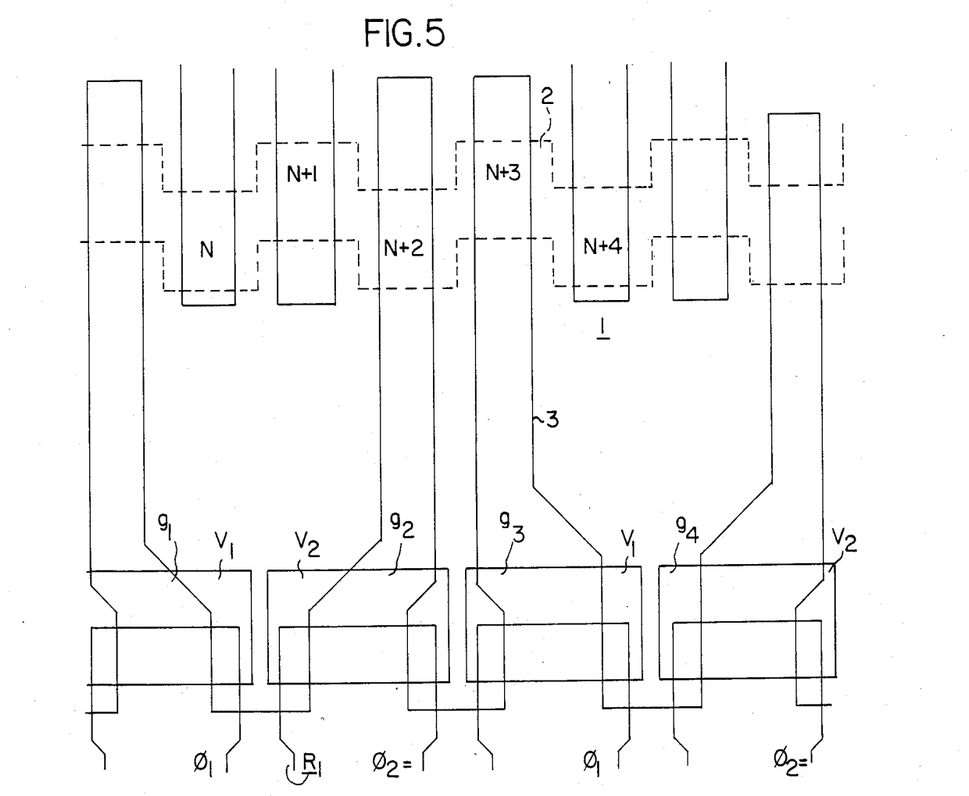
FIGS. 5 and 6, schemes showing how can be integrated the device represented in FIG. 3.
Figure 6:
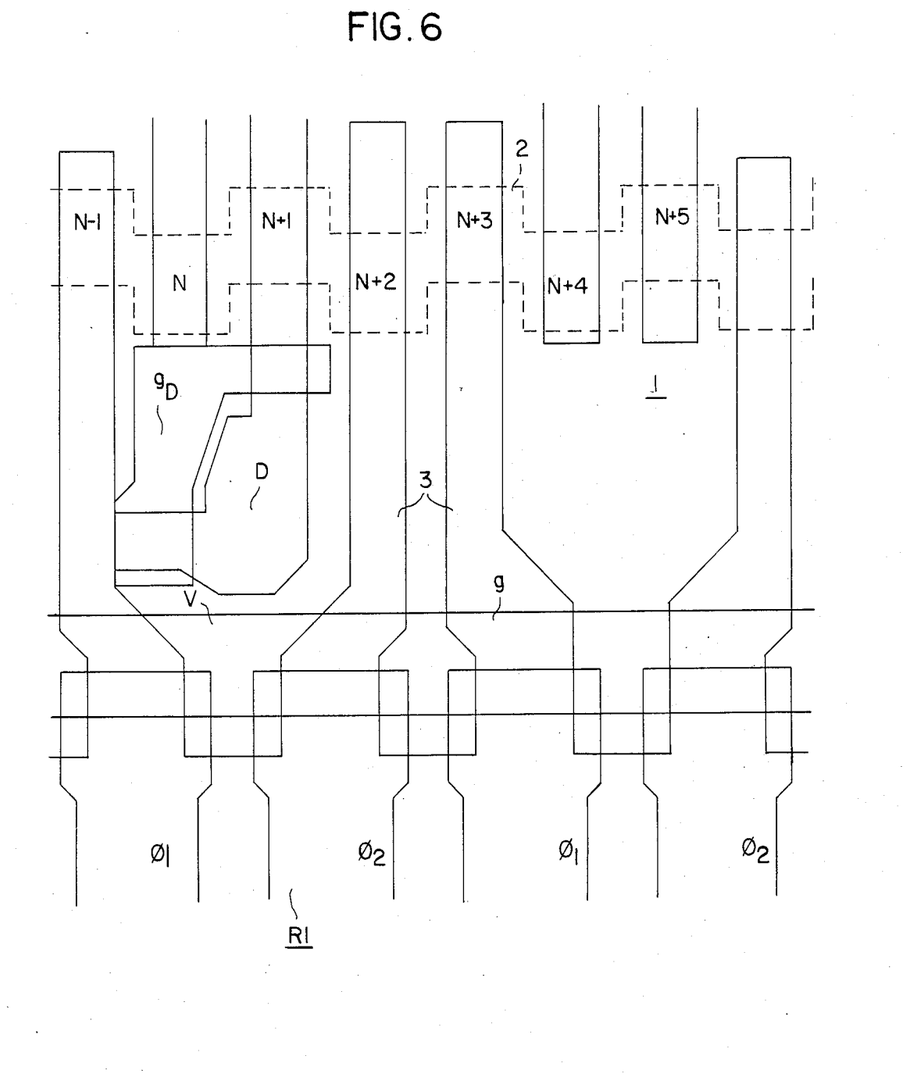

FIGS. 5 and 6 show how can be integrated on a semiconductor substrate the device of FIG. 3.

These figures represent in broken lines the strip 1 of FIG. 3. The broken lines correspond to a window 2 realized in an opaque element to allow the utilization of the semi-conductor substrate.

In the semi-conductor substate, is realized by diffusion for example, conducting zones 3. These conducting zones have rectangular shapes, disposed parallel-wise to one another and regularly spaced apart. These rectangles are positioned facing each other two by two by their end to constitute the strip and are connected by their base to constitute the registers.

These conducting zones thus constitute photosensitive elements N, N+1, N+2 . . . that are photodiodes as well as connections of the photosensitive elements to the read-out registers. On FIGS. 5 and 6, the two rows of the photosensitive elements are shifted by half of their height as on FIG. 3.

FIGS. 5 and 6 only represent register $R_1$ of FIG. 3, the register $R_2$ of FIG. 3 which has not been represented would be located in the upper part of FIGS. 5 and 6. In the continuation of the description, what is said with regard to register $R_1$ could also apply to the register $R_2$.

FIGS. 5 and 6, only represent in strong lines the storage electrodes of the register $R_1$.

It relates to a charge transfer shift register comprising storage electrodes and transfer electrodes located on an oxide overthickness, as the register represented on FIGS. 4a and b.

Clock signals $\phi_1$ and $\phi_2$ are applied to one storage electrode-transfer electrode couple out of two. On FIGS. 5 and 6, the clock signal $\phi_1$ is applied to the electrodes connected to the elements of the first row and the clock signal $\phi_2$ is applied to the electrodes connected to the elements of the second row.

On FIG. 5, grids represented in strong lines, control the passage of the charges issuing from the photosensitive dots towards the register. These grids bear references $G_1$, $G_2$, $G_3$, $G_4$.... One grid out of two receives a control signal $V_1$ and the other a control signal $V_2$.

On FIG. 6, a single grid G that receives the control signal V controls the passage of the charges coming from all over the strip.

Figures 7A, 7B, 7C:
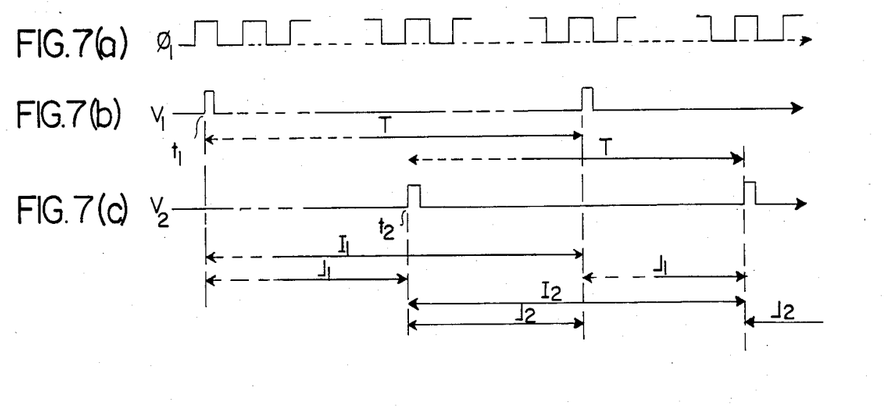
FIGS. 7a to c and 8a to c, the control signals applied to the devices of FIGS. 5 and 6.

FIGS. 7a, b and c represent the control signals applied to the device shown in FIG. 5.

The registre $R_1$ of FIG. 5 can operate in monophase, i.e. for example, the signal $\phi_1$ is a clock signal that varies periodically from a low level to a high level whereas signal $\phi_2$ is constant. FIG. 7a shows the signal $\phi_1$. FIGS. 7b and c show the clock signals $V_1$ and $V_2$ applied to the passage grids. These signals are normally at the low level and pass to the high level with the same periodicity T, for example, when $\phi_1$ is at the high level.

It is considered that the devices of FIGS. 5 and 6, are integrated on a semi-conductor substrate, made of silicium for example, of the P type and thus that when a clock signal at the high level is applied to the grids $G_1$, $G_2$, $G_3$ ... or G, these grids allow the passage of the charges of the photosensitive dots towards the registers.

On FIG. 7b, at time $t_1$, $V_1$ passes to the high level whereas $\phi_1$ is at the high level. There is a transfer in the register $R_1$ the charges integrated by the first row of photosensitive dots. A further integration period $I_1$ begins for this first row that ends with the next passage of $V_1$ at high level. The charges transferred into the register $R_1$ at the time $t_1$ are transferred towards the output due to the clock signals $\phi_1$ and $\phi_2$.

On the FIG. 7c, at time $t_2$, $V_2$ passes at the high level whereas $\phi_1$ is at the high level. There is transfer in the register $R_1$ of the charges integrated by the second row of photosensitive dots. A further integration period $I_2$ of duration T equal to that of $I_1$ begins for this second row which ends with the next passage of $V_2$ at the high level, whereas the transfer of the charges towards the output of the register begins. The time intervals that can be used to transfer the charges of the two rows are designated by $J_1$ and $J_2$ on the FIG. 7c.

Figure 2:
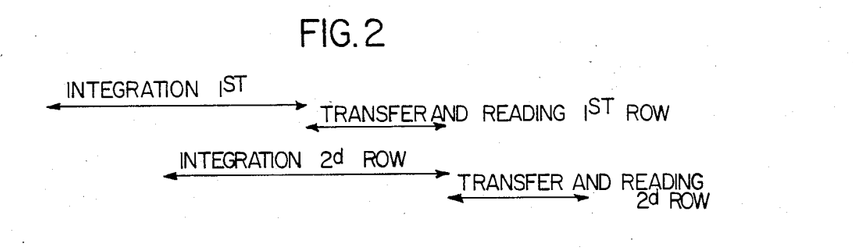
FIG. 2 a diagram representing the series of the different processing steps of one line of data in the case of the device of FIG. 1.

On these FIGS. 7b and c, as on FIG. 2, the integration periods $I_1$ and $I_2$ of the two rows of photosensitive elements are shifted by the half of the integration period T, which corresponds to the shifting of half the height of the photosensitive dots that is adopted on FIG. 5.

It is possible to adopt for the two rows a different shifting from that represented in FIG. 5. It is thus necessary to modify the clock signals $V_1$ and $V_2$ so that the covering of periods $I_1$ and $I_2$ corresponds to the shifting of the two rows. The drawback is that the durations $J_1$ and $J_2$ available for transferring the charges in the registers and evacuating them from the registers are not equal. In this embodiment, the shift between the two rows is in a preferred manner equal to half the height of the photosensitive dots in the analysis direction of the image and at a minimum equal to the product of the minimum time necessary for the reading of a register by the displacement speed of the image to be analyzed on the strip.

In order to cause to vary integration period T, it is necessary to act on the period of signals $V_1$ and $V_2$ and on the frequency of reading of the registers.

FIG. 6 is distinguished from FIG. 5, because the shift register $R_1$ is biphase and thus uses two clock signals $\phi_1$ and $\phi_2$ in phase opposition which vary between a low level and a high level. These signals are represented on FIGS. 8a and b.

The fact that register $R_1$ is biphase allows only one grid G to be used between the strip and the register R which simplifies the realization of the device. This grid receives the control signal V represented on FIG. 8c. The signal V passes periodically at the high level and its periodicity is chosen so that it passes at the high level while $\phi_1$ is at the high level, and while $O_2$ is at the high level. The utilization of polyphase operating registers allows to use a single grid G between the strip and each register.

Figures 8A, 8B, 8C:
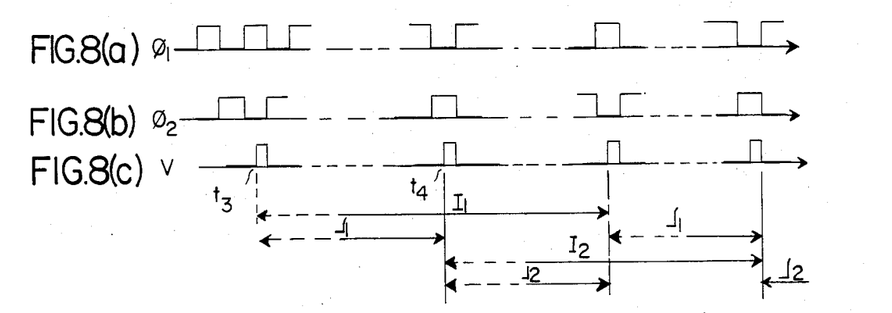

At time $t_3$, V and $\phi_1$ are at the high level and the charges integrated by the first row of photosensitive dots are transferred in the register $R_1$ and shifted towards the output. A further integration period $I_1$ begins for the first row, it will end when V and $\phi_1$ are again at the high level.

At time $t_4$, V and $\phi_2$ are at the high level, the charges integrated by the second row of photosensitive dots are transferred in the register $R_1$ and shifted towards the output. A further integration period $I_2$ begins for the second row, it will end when V and $\phi_2$ are again at the high level.

In order to cause to vary the integration period, it is possible to act on the period of the clock signal V and on the frequency of the registers.

In order to obtain a variable integration time other than by acting on the control signals V, $V_1$ and $V_2$, means represented on the left-hand side of FIG. 6 can be used. These means could be used in the same way in the embodiment of FIG. 5 or in other embodiments of the invention. Without these means, the integration time is always equal at least to the sum of the two read-out times $J_1$ and $J_2$. These means allow to diminish the integration time beyond this limit.

These means are constituted by a charge drain D and by a grid $G_D$ that controls the passage between the photosensitive point and the drain.

In FIG. 6, the means are housed in the space comprised between the strip and the register $R_1$.

The means represented on the left-hand part of FIG. 6 allow to obtain a variable integration time for the two photosensitive dots $N-1$ and $N+1$. The grid $G_D$ has a substantially right angle form, one of the branches of the right angle cuts the conducting zone 3 connected to the photosensitive dot $N+1$ whereas the other branch of the right angle is parallel to the conducting zone 3 connected to the photosensitive dot $N-1$.

Drain D also has a substantially right angle form. The two branches of the right angle constituting the drain D are substantially perpendicular to the two branches of the right angle constituting the grid $G_D$.

Figure 9:
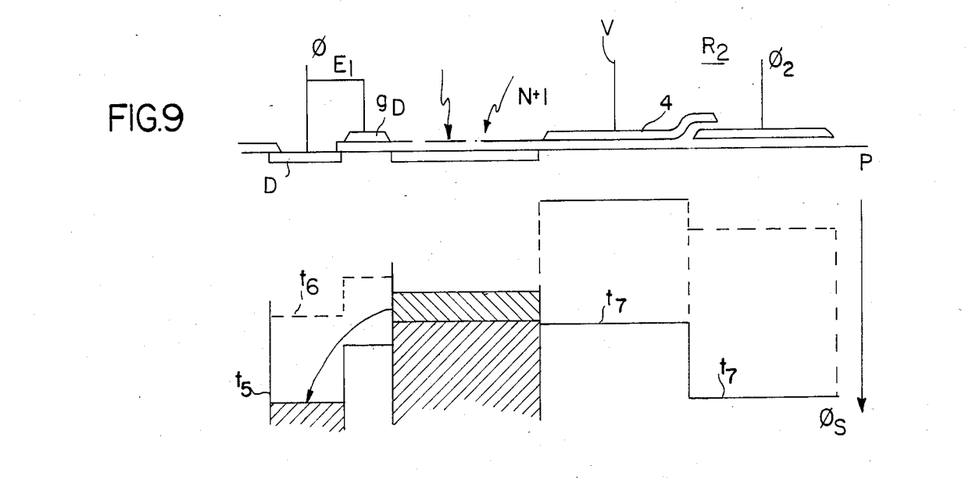

FIG. 9a represents a transversal cross-section view of the means associated to the photosensitive dot $N+1$, of the photosensitive dot $N+1$ and of the part of the register $R_2$ to which this dot is connected.

FIG. 9b represents the evolution of the surface potentials in the semi-conductor substrate in which is integrated the device of FIG. 9a at various moments.

It is supposed that it concerns a P type substrate and increasing surface potentials are directed towards the bottom.

Figure 10A:
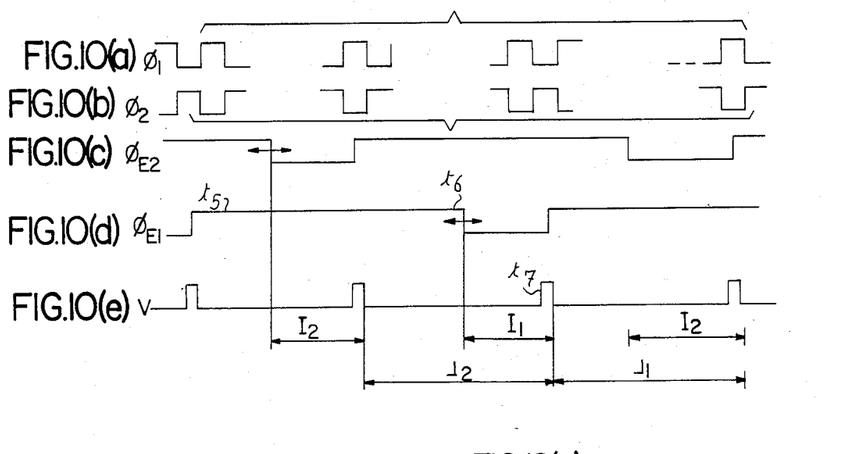

Grid $G_D$ and drain D of the means receive a control signal $\phi_{E1}$ that is represented on FIG. 10d. At instant $t_5$, the signal $\phi_{E1}$ is at the high level, the surface potential under grid $G_D$ and drain D are represented in a continuous line on FIG. 9b. There is a transfer towards the drain of the charges injected by the radiation in the photodiode N+1. This transfer occurs until instant $t_6$ where $\phi_{E1}$ passes at the low level. The potential existing at $t_6$ under $G_D$ and D is represented in a broken line on FIG. 9b. It is only at this instant $t_6$ that the integration period $I_1$ of the first row begins, this period ends at instant $t_7$ when V and $\phi_2$ are at the high level, which provokes the transfer of the charges from the first row in the register.

It is thus observed that to modify the integration period of the first row, it is sufficient to modify the duration of passage at the high level of the signal $\phi_{E1}$.

So that the integration time $I_2$ of the photosensitive dots of the second row are modified in the same way as the integration time $I_1$, to the grids controlling the passage between the photosensitive dots of the second row and an evacuation drain is applied a clock signal $O_{E2}$, shifted with respect to $\phi_{E1}$, but which remains at the high level for a duration equal to the passage at the high level of $\phi_{E1}$.

It must be signalled that the said means can also be used to evacuate the excess charges during the integration period of dots N−1 or N+1.

FIG. 9b represents in broken lines the surface potential under the diode D and the grid $G_D$ when $\phi_{E1}$ is at the low level, at the time $t_6$, while the integration of the charges in the photosensitive dot N+1 begins.

If dot N+1 is overlit, the excess charges are evacuated above grid $G_D$ towards drain D.

The said means thus have at least one of the two following functions according to the control signal applied:

evacuation of the excess charges during the integration time;

adjustment of integration time by evacuating the charges issuing from the photosensitive elements during part of the integration time.

In the case of the device according to the invention represented on FIG. 6, it is possible to dispose easily of two different resolutions. For this, it is possible to provoke the simultaneous transfer in each stage of the register of the charges accumulated in the first row of elements, and in the second row of elements. The two parts of each stage of the register thus contain charges and when these charges are transferred towards the output, there is sommation of the charges contained in the two adjacent parts, which provokes the sommation of the data provided by two adjacent points belonging one to the first row and the other to the second row.

Figure 12A:
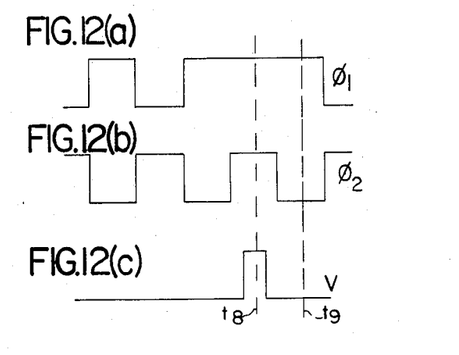

FIGS. 12a and b represent the control signals $\phi_1$ and $\phi_2$ of the register $R_1$. To reduce the resolution, a passage at the low level of the signal $\phi_1$ has been suppressed. At the time $t_8$, $\phi_1$, $\phi_2$ and V are at the high level. There is a transfer in the register of the charges issuing from the first and second rows of photosensitive elements. At time $t_9$, $\phi_1$ is at the high level and $\phi_2$ and V are at the low level.

Figure 11A:
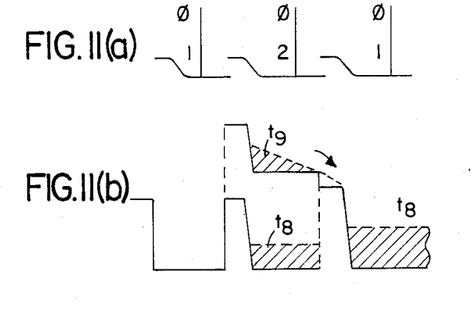
FIGS. 11a and b and 13a, b and c, transversal section views and schemes explaining the operation of a device according to the invention having two resolutions.

As represented in FIG. 11b, there is sommation under the storage electrodes connected to $\phi_1$ of the charges present under the storage electrodes connected to $\phi_1$ and $\phi_2$ and that are represented on FIG. 11a.

Figure 14A:
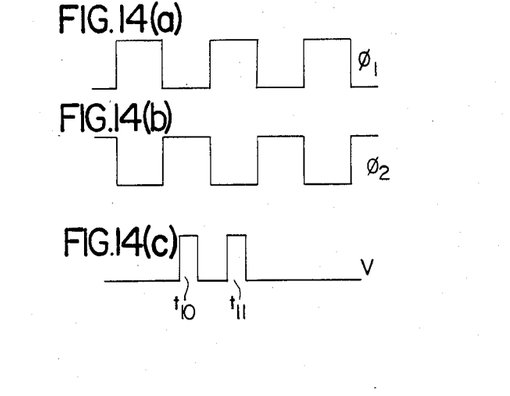

It is also possible to obtain a device having two different resolutions without modifying signals $\phi_1$ and $\phi_2$. It is simply necessary to generate two consecutive pulses V, one at time $t_{10}$ when $\phi_2$ is at the high level and the other at time $t_{11}$ close to $t_{10}$ when $\phi_2$ has passed to the low level and $\phi_1$ is at the high level. The signals $\phi_1$, $\phi_2$ and V are represented on FIGS. 14a, b and c. At the time $t_{10}$, there is transfer under the storage electrodes connected to $\phi_2$ of the charges issuing from one of the rows of the photosensitive zone.

At time $t_{11}$, the charges stored under the electrodes connected to $\phi_2$ are transferred under the storage electrodes connected to $\phi_1$, that receive the charges issuing from the other row of the sensitive zone.

Figure 13A:
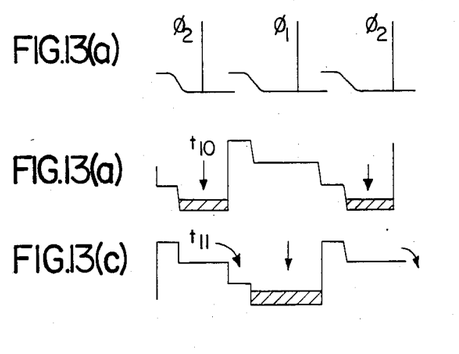

These charge movements are represented on FIGS. 13b and c.

There is thus transfer in each stage of the register successively of the charges accumulated in the first and second rows of photosensitive elements and sommation of the charges gathered on the two adjacent photosensitive elements belonging to two different rows.

What is claimed is:

1. A charge transfer photosensitive device for image analysis, line after line, comprising:
   a strip of photosensitive elements, of which one photosensitive element out of two is shifted in the direction of analysis of the image, the elements being disposed on first and second rows;
   at least one charge transfer shift register with parallel inputs and series output;
   first means ensuring, for one line analyzed, transfer into said register and reading, successively, of the charges due to this line and accumulated in said first row of elements for a given integration duration, then of the charges due to this line and accumulated in said second row of elements, for said integration duration and second means ensuring adaptation of the displacement speed of each line to be analyzed on said strip at the shift between said two rows of photosensitive elements in such a way that two successive readings of said register concern a single line of the image.

2. A device according to claim 1, comprising two charge transfer shift registers, alternate pairs of successive photosensitive elements of said strip being processed by respective ones of said registers.

3. A device according to claim 1, wherein each stage of said register comprises two charge inputs and wherein said register inputs are alternately supplied by elements from the first and second rows of photosensitive elements.

4. A device according to claim 3, wherein said charge transfer shift register operates in monophase and wherein each photosensitive element comprises a grid that controls the passage of the charges of said strip toward said register.

5. A device according to claim 3, wherein said charge transfer shift register operates in polyphase and wherein each register comprises a single grid that controls the passage of the charges of said strip towards said register.

6. A device according to claim 1, further comprising, adjacent to each photosensitive element, a charge evacuation drain separated from said photosensitive element by a grid receiving a control signal, the assembly ensuring at least one of the two following functions according to the control signal applied:

evacuation of the charges in excess during integration time;

adjustment of said integration time by evacuating the charges issuing from said photosensitive elements during one part of said integration time.

7. A charge transfer photosensitive device for image analysis, line after line, comprising:

a strip of photosensitive elements, of which one photosensitive element out of two is shifted in the direction of analysis of the image, the elements being disposed on first and second rows;

at least one charge transfer shift register with parallel inputs and series output:

first means ensuring transfer in each stage of said register successively of charges accumulated in said first and second rows of elements and transfer of charges towards the output of said register, which provokes the summation of the charges gathered on two adjacent photosensitive elements belonging to different rows;

second means ensuring adaptation of the displacement speed of each line to be analyzed on said strip at the shift between said two rows of photosensitive elements in such a way that two successive readings of said register concern a single line of the image.

8. A charge transfer imaging device for line by line scanning comprising:

a horizontal strip including a succession of photosensitive elements aligned in first and second rows, vertically displaced from one another, alternate elements of the succession being in respective ones of the first and second rows, first and second charge transfer shift registers, every other element in the first row and one of its neighbors in the second row being inputted to the first register and the remaining elements being inputted to the second register, each shift register comprising a plurality of stages, each stage having two inputs one of which is inputted by an element of the first row, the other of which is inputted by an element of the second row, and means for inputting all the elements of the first row to their respective registers at a first time and all the elements of the second row to their respective registers at a second time.

* * * * *